United States Patent
Wu et al.

(10) Patent No.: US 7,248,134 B2
(45) Date of Patent: Jul. 24, 2007

(54) INDUCTOR AND CAPACITOR FORMED OF BUILD-UP VIAS

(75) Inventors: Sung-Mao Wu, Kaohsiung County (TW); Chi-Tsung Chiu, Kaohsiung (TW); Chih-Pin Hung, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 84 days.

(21) Appl. No.: 11/186,859

(22) Filed: Jul. 22, 2005

(65) Prior Publication Data
US 2006/0103483 A1    May 18, 2006

(30) Foreign Application Priority Data
Nov. 12, 2004   (TW) ............................... 93134636 A

(51) Int. Cl.
*H01P 3/08*   (2006.01)
(52) U.S. Cl. ..................................... 333/246; 333/33

(58) Field of Classification Search .............. 333/246, 333/33, 219, 175, 176, 185, 245
See application file for complete search history.

(56) References Cited

U.S. PATENT DOCUMENTS

| | | | | |
|---|---|---|---|---|
| 5,451,917 A | * | 9/1995 | Yamamoto et al. | 333/246 |
| 5,886,597 A | * | 3/1999 | Riad | 333/245 |
| 6,091,310 A | * | 7/2000 | Utsumi et al. | 333/12 |

* cited by examiner

*Primary Examiner*—Benny Lee
(74) *Attorney, Agent, or Firm*—Birch, Stewart, Kolasch & Birch, LLP

(57) ABSTRACT

An inductor and capacitor implemented with build-up vias. The inductor and capacitor comprise a conductor plane, a dielectric layer, an inductor/capacitor inducing build-up via and a conductor layer. There is a conducting material in the inductor/capacitor inducing build-up via and a fist end thereof is in contact with the conductor plane. The length of the inductor inducing build-up via is larger than one fourth of a signal wavelength while the length of the conductor inducing build-up via is smaller than one fourth of a signal wavelength.

6 Claims, 2 Drawing Sheets

INDUCTOR AND CAPACITOR FORMED OF BUILD-UP VIAS

BACKGROUND OF THE INVENTION

FIELD OF THE INVENTION

The invention relates to semiconductor packaging and, in particular, to an inductor and a capacitor formed of build-up vias for semiconductor packaging.

Capacitors, inductors, filters, and other circuits are often required on a packaging substrate to form a module or a system. The passive elements, such as resistors, capacitors and inductors, are typically formed of chip-type passive elements and high-K or low-K materials in the packaging substrate. Alternatively, an inductor can be formed by varying routing width on the packaging substrate, as shown in FIG. 1A. Also, a capacitor can be formed by disconnecting the routes, as shown in FIG. 1B.

However, additional discrete chip-type passive elements increase packaging cost and failure probability, resulting in diminished reliability.

SUMMARY OF THE INVENTION

An embodiment of an inductor and capacitor formed of build-up vias utilizes an electric field disturbance resulting from current. generated when a via is parallel with an electric field. Thus, an equivalent inductor or capacitor can be formed.

An embodiment of an inductor formed of build-up vias comprises a conductor plane, a dielectric layer, an inductor inducing build-up via, and a signal transmission layer. The inductor inducing build-up via is formed in the dielectric layer and filled with a conductive material. The signal transmission layer contacts the conductive material in the inductor inducing build-up via, wherein a length of the inductor inducing build-up via is larger than one fourth of a signal wavelength.

Another embodiment of a capacitor formed of build-up vias comprises a conductor plane, a dielectric layer, a capacitor inducing build-up via, and a signal transmission layer. The capacitor inducing build-up via is formed in the dielectric layer and filled with a conductive material. The signal transmission layer contacts the conductive material in the. capacitor inducing build-up via, wherein a length of the capacitor inducing build-up via is smaller than one fourth of a signal wavelength.

Inductors and capacitors formed of build-up vias have two characteristics. First, use of chip-type passive elements can be minimized, thus cost can be reduced and routing flexibility can be increased. Second, use of high-K or low-K dielectric materials in a packaging substrate can be minimized, thus improving reliability.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
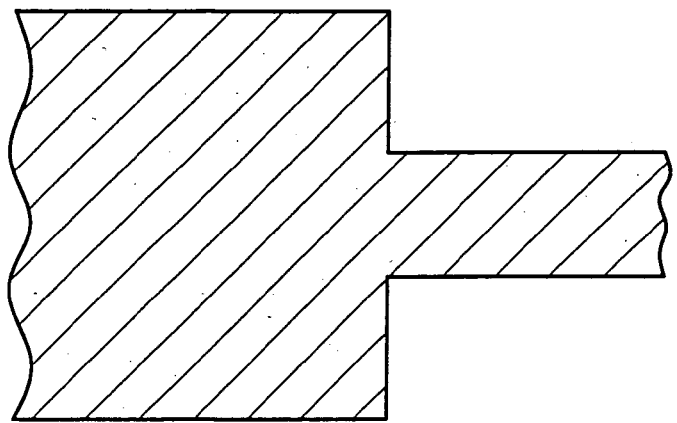
FIG. 1A shows a related art inductor formed by varying routing width on the packaging substrate.
Figure 1B:
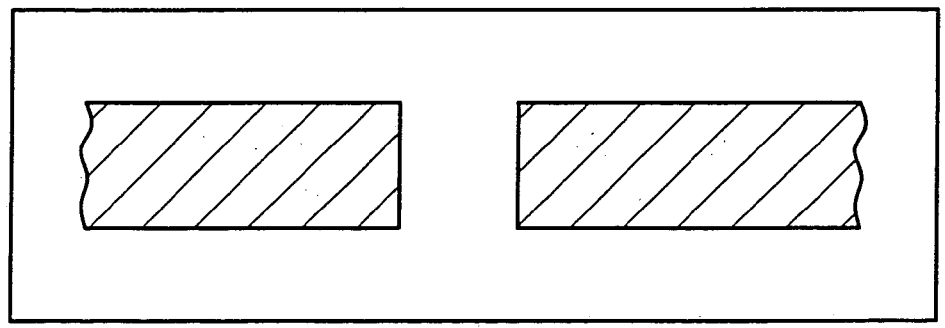
FIG. 1B shows a related art capacitor formed by disconnecting routes on the packaging substrate.
Figure 2:
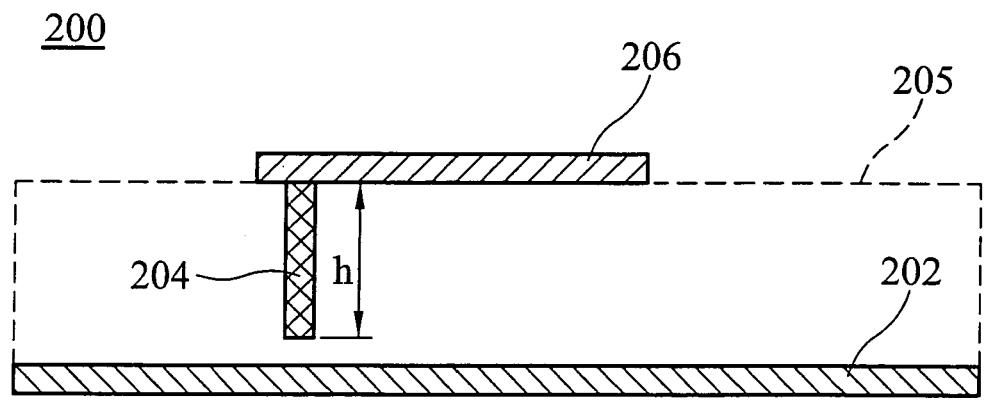
FIG. 2 shows an inductor formed of build-up vias according to an embodiment of the invention.

FIG. 2 shows an inductor formed of build-up vias according to an embodiment of the invention. The inductor 200 comprises a conductor plane 202, an inductor inducing build-up via 204, a dielectric layer 205 and a signal transmission layer 206. The inductor inducing build-up via 204 is formed in the dielectric layer 205 and filled with a conductive material. The inductor inducing build-up via 204 does not penetrates through the dielectric layer 205. The signal transmission layer 206 is in contact with the conductive material in the inductor inducing build-up via 204, wherein a length h of the inductor inducing build-up via 204 is larger than one fourth of a signal wavelength. The signal transmission layer 206 maybe a patterned circuit. The conductor plane, the conductive material in the inductor inducing build-up via and the transmission layer are formed of the same metal. More specifically, the metal is copper.

A current is generated when the inductor inducing build-up via 204 is parallel with an electric field and the electric field is disturbed by the current. If the length h of the inductor inducing build-up via is larger than one fourth of a signal wavelength, an equivalent inductor is formed.

Figure 3:
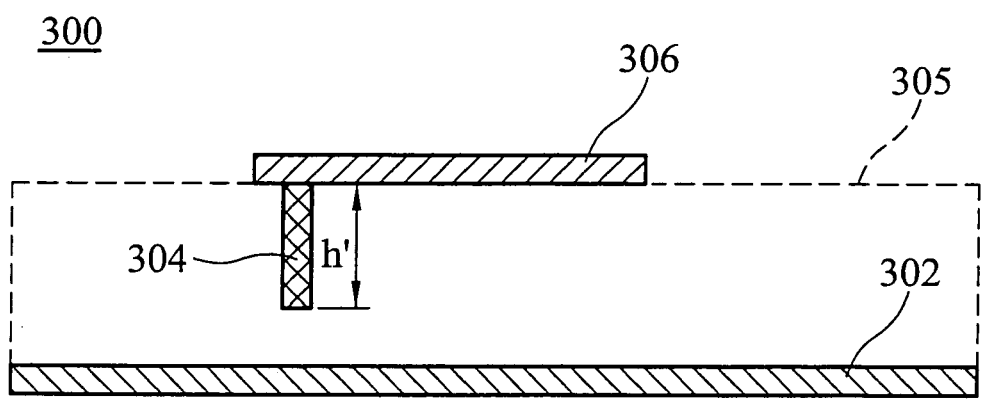
FIG. 3 shows a capacitor formed of build-up vias according to an embodiment of the invention.

FIG. 3 shows a capacitor formed of build-up vias according to another embodiment of the invention. The capacitor 300 comprises a conductor plane 302, a capacitor inducing build-up via 304, a dielectric layer 305 and a signal transmission layer 306. The capacitor inducing build-up via 304 is formed in the dielectric layer 305 and filled with a conductive material. The signal transmission layer 306 is in contact with the conductive material in the capacitor inducing build-up via 304, wherein a length h' of the capacitor inducing build-up via 304 is smaller than one fourth of a signal wavelength. The conductor plane, the conductive material in the capacitor inducing build-up via and the transmission layer are formed of the same metal. More specifically, the metal is copper.

A current is generated when the capacitor inducing build-up via 304 is parallel with an electric field and the electric field is disturbed by the current. If the length h' of the capacitor inducing build-up. via is smaller than one fourth of a signal wavelength, an equivalent capacitor is formed.

Different circuits, such as filters (high-pass filters, band-pass filters and low-pass filters) and other impedance matching circuits, can be formed of the inductors and capacitors according to the invention. Additionally, inductors and capacitors according to the invention can be used if a sufficient coupling capacitor, bypass capacitor and matching inductor is not provided during design.

Furthermore, inductors and capacitors formed of build-up vias have two characteristics. First, use of chip-type passive elements can be minimized, thus cost can be reduced and routing flexibility can be increased. Second, use of high-K or low-K dielectric materials in a packaging substrate can be minimized, thus improving reliability.

While the invention has been described by way of example and in terms of preferred embodiment, it is to be understood that the invention is not limited thereto. To the contrary, it is intended to cover various modifications and (as would be apparent to those skilled in the art). Therefore, the scope of the appended claims should be accorded the broadest interpretation so as to encompass all such modifications.

What is claimed is:

1. An inductor comprised of a via, the inductor comprising:
    a conductor plane which is an unpatterned metal plane;
    a dielectric layer disposed on the conductor plane;
    an inductor inducing via disposed in the dielectric layer and filled with a conductive material, wherein the via does not fully penetrate through the dielectric layer; and
    a signal transmission layer, in contact with the conductive material in the inductor inducing via, wherein the signal transmission layer is a patterned circuit;
    wherein a length of the inductor inducing via is longer than one fourth of a signal wavelength.

2. The inductor as claimed in claim 1, wherein the conductor plane, the conductive material in the inductor inducing via and the transmission layer are comprised of the same metal.

3. The inductor as claimed in claim 2, wherein the metal is copper.

4. A capacitor comprised of a via, the capacitor comprising:
    a conductor plane which is an unpatterned metal plane;
    a dielectric layer disposed on the conductor plane;
    a capacitor inducing via disposed in the dielectric layer and filled with a conductive material, wherein the via does not fully penetrate through the dielectric layer; and
    a signal transmission layer, in contact with the conductive material in the capacitor inducing via, wherein the signal transmission layer is a patterned circuit;
    wherein a length of the capacitor inducing via is smaller than one fourth of a signal wavelength.

5. The capacitor as claimed in claim 4, wherein the conductor plane, the conductive material in the capacitor inducing via and the transmission layer are comprised of the same metal.

6. The capacitor as claimed in claim 5, wherein the metal is copper.

* * * * *